United States Patent
Ryu et al.

(10) Patent No.: US 8,053,868 B2
(45) Date of Patent: Nov. 8, 2011

(54) WAFER LEVEL CHIP SCALE PACKAGE OF IMAGE SENSOR AND MANUFACTURING METHOD THEREOF

(75) Inventors: Jin Mun Ryu, Yongin (KR); Jung Jin Kim, Hwaseong (KR); Hyung Kyu Park, Suwon (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 100 days.

(21) Appl. No.: 11/905,314

(22) Filed: Sep. 28, 2007

(65) Prior Publication Data

US 2008/0083965 A1   Apr. 10, 2008

(30) Foreign Application Priority Data

Oct. 10, 2006  (KR) .................... 10-2006-0098468

(51) Int. Cl.
*H01L 27/148* (2006.01)
*H01L 29/04* (2006.01)
*H01L 23/544* (2006.01)

(52) U.S. Cl. .................... 257/620; 257/59; 257/222

(58) Field of Classification Search ........... 257/E31.117, 257/431–466, 666–797, 59, 222, 620
See application file for complete search history.

(56) References Cited

U.S. PATENT DOCUMENTS

| | | | |
|---|---|---|---|
| 6,696,738 B1 * | 2/2004 | Tu et al. ................... | 257/433 |
| 6,747,261 B1 * | 6/2004 | Hsieh et al. ............... | 250/208.1 |
| 6,841,874 B1 | 1/2005 | Paek et al. | |
| 7,067,354 B2 * | 6/2006 | Prabhu ..................... | 438/113 |
| 7,399,683 B2 * | 7/2008 | Noma et al. .............. | 438/465 |
| 7,662,670 B2 * | 2/2010 | Noma et al. .............. | 438/114 |
| 2003/0209772 A1 * | 11/2003 | Prabhu ..................... | 257/434 |
| 2004/0121562 A1 * | 6/2004 | Wakui et al. .............. | 438/465 |
| 2005/0095750 A1 * | 5/2005 | Lo et al. .................... | 438/114 |
| 2005/0151228 A1 * | 7/2005 | Tanida et al. .............. | 257/620 |
| 2005/0161788 A1 * | 7/2005 | Shizuno .................... | 257/678 |
| 2005/0161805 A1 * | 7/2005 | Ono et al. ................. | 257/704 |
| 2006/0043514 A1 * | 3/2006 | Shizuno .................... | 257/434 |
| 2006/0213804 A1 * | 9/2006 | Yu et al. ..................... | 206/710 |
| 2006/0267125 A1 * | 11/2006 | Huang et al. .............. | 257/433 |
| 2007/0080418 A1 * | 4/2007 | Ryu ............................ | 257/459 |

FOREIGN PATENT DOCUMENTS

| | | |
|---|---|---|
| JP | 2002-329850 | 11/2002 |
| KR | 10-0244580 | 11/1999 |
| KR | 10-2002-0037865 | 5/2002 |
| KR | 10-2006-0083253 | 7/2006 |

\* cited by examiner

*Primary Examiner* — James Mitchell

(57) ABSTRACT

Provided are a wafer level chip scale package of an image sensor and a manufacturing method thereof. The wafer level chip scale package includes: a wafer including an image sensor and a pad on the top surface thereof and inclined surfaces on both ends thereof; expansion pads formed on the inclined surfaces of the wafer, including the pad, such that the expansion pads are electrically connected to the pad, a bottom surface of the expansion pads being on a straight line with respect to that of the wafer; a support formed on the expansion pads to support both bottom surfaces of a glass, the support having a height to provide a space where an air cavity is formed; and a glass disposed on the support to provide the air cavity over the wafer.

3 Claims, 4 Drawing Sheets

[FIG. 1 – PRIOR ART]
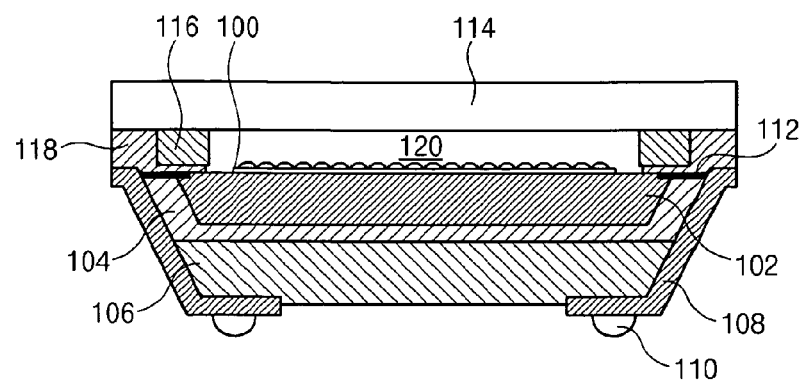
[FIG. 2]
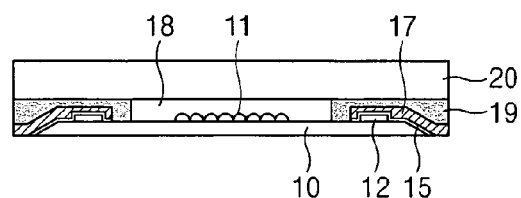
[FIG. 3A]
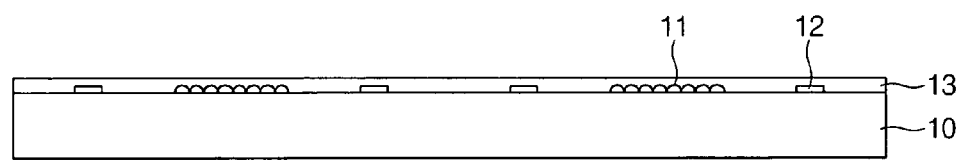
[FIG. 3B]
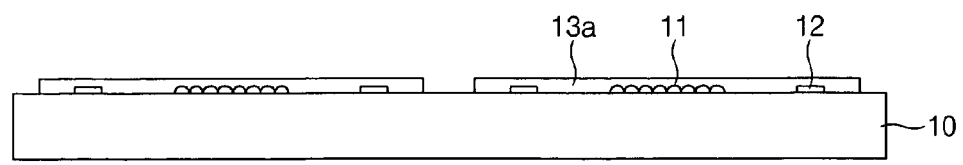
[FIG. 4A]
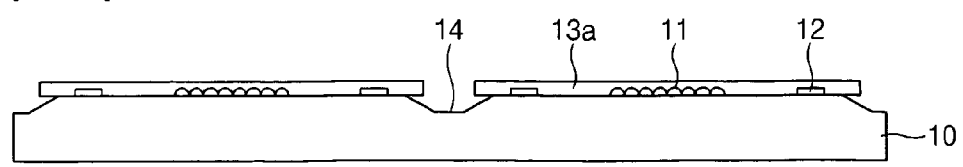

[FIG. 4B]
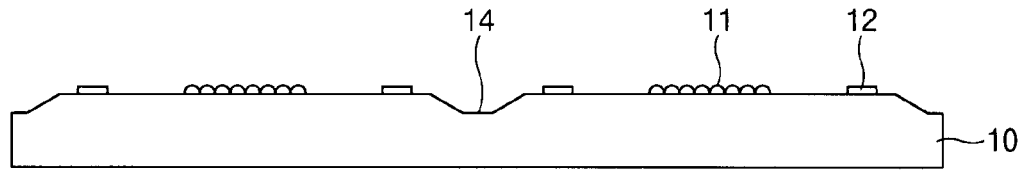
[FIG. 5]
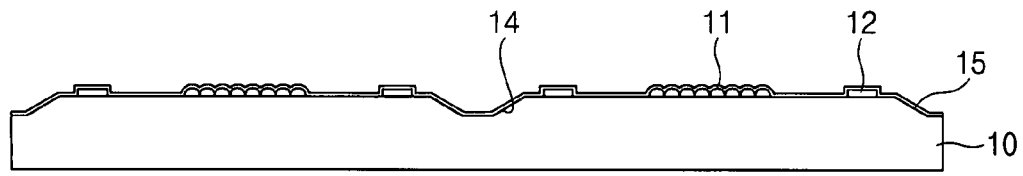
[FIG. 6A]
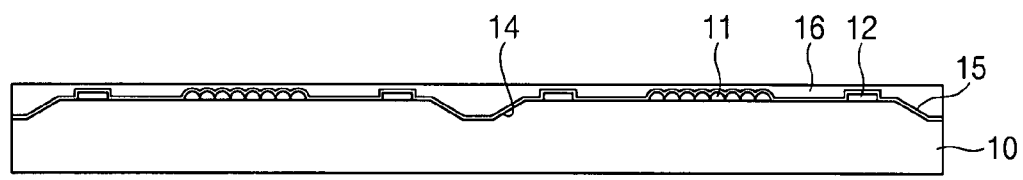
[FIG. 6B]
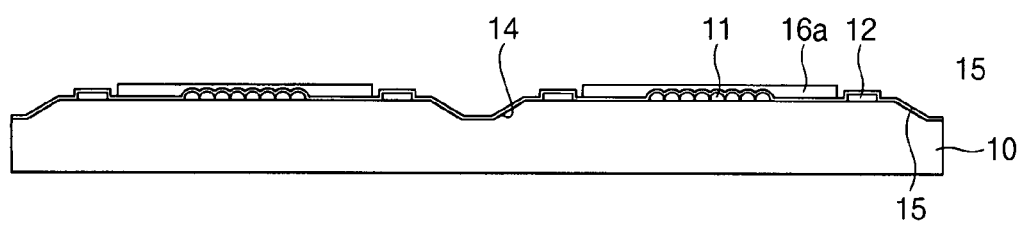
[FIG. 7A]
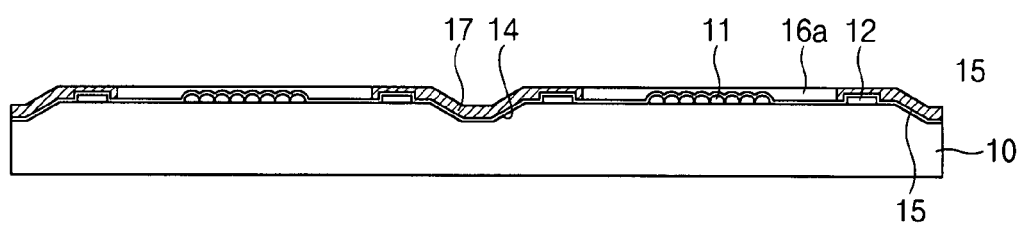
[FIG. 7B]
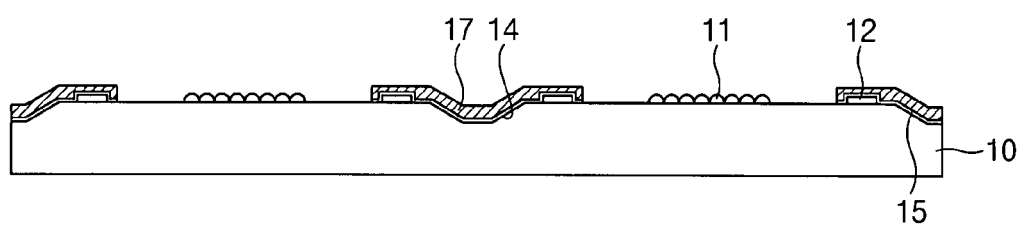

[FIG. 8]
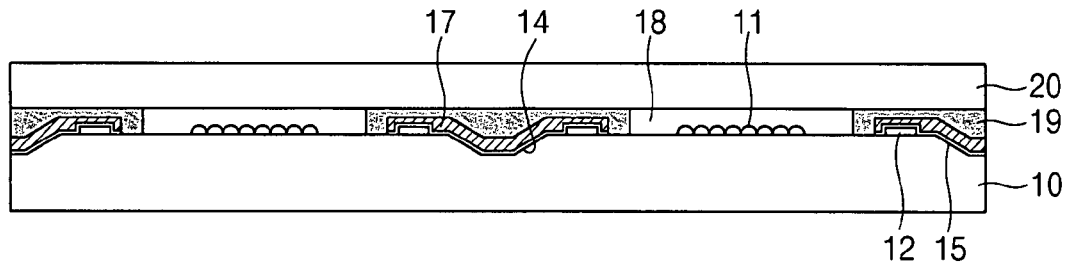
[FIG. 9]
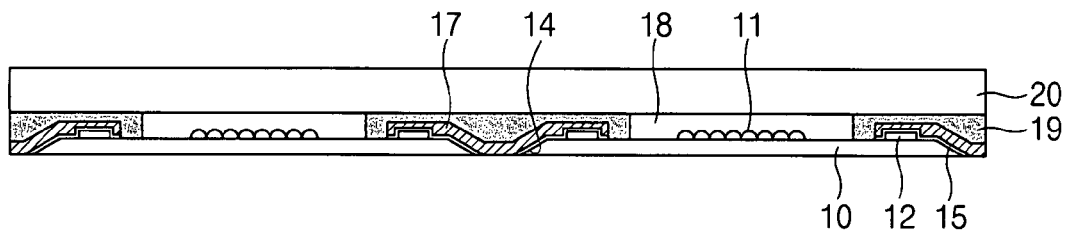
[FIG. 10]
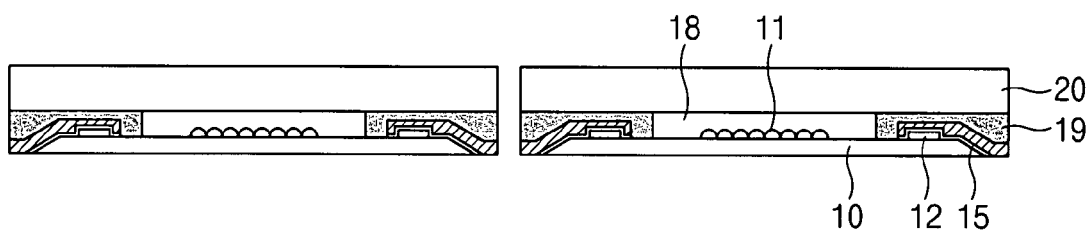
[FIG. 11]
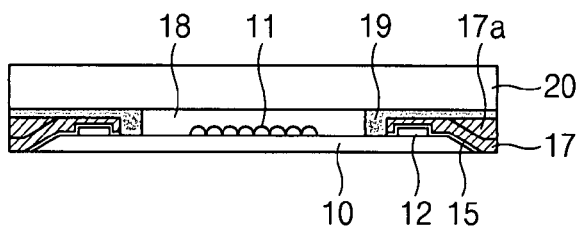
[FIG. 12A]
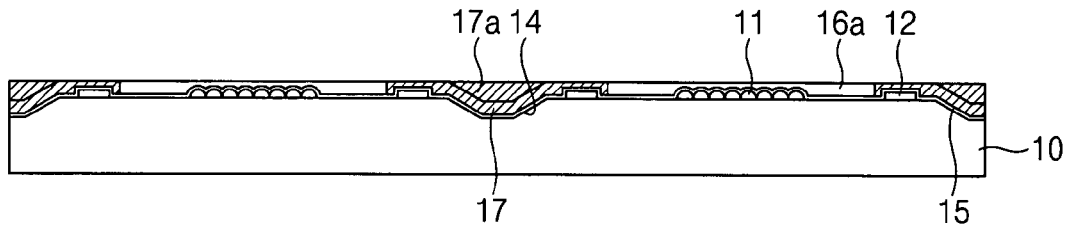

[FIG. 12B]
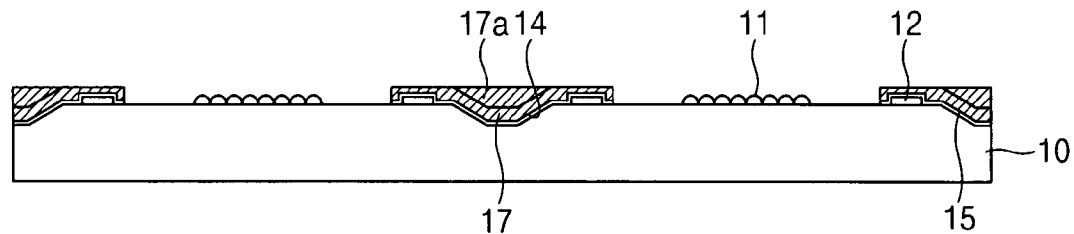
[FIG. 13]
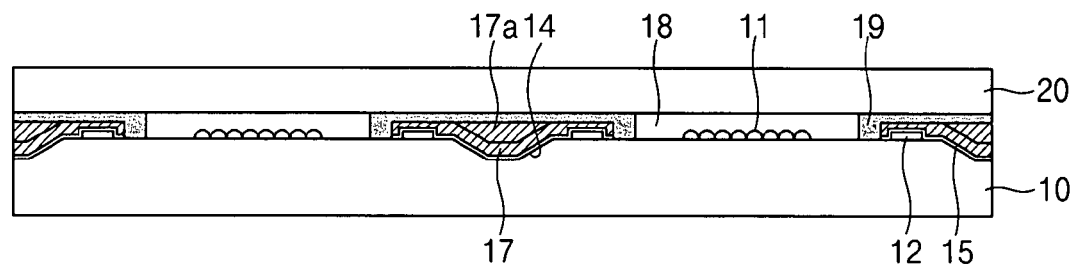
[FIG. 14]
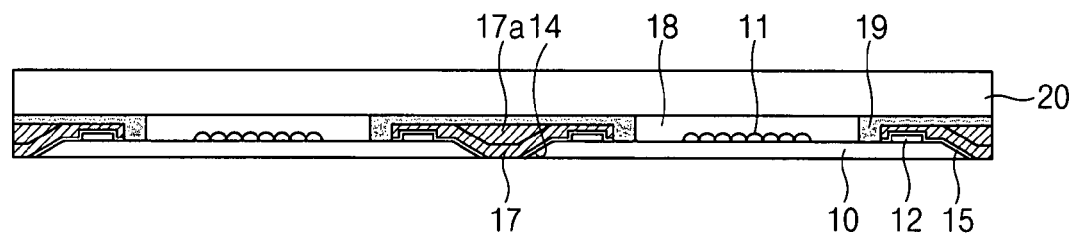
[FIG. 15]
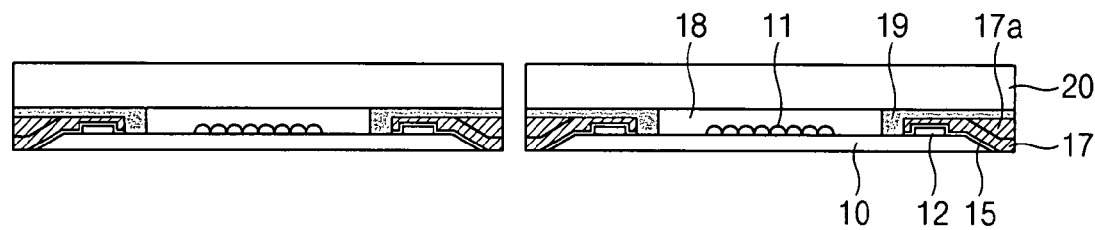

WAFER LEVEL CHIP SCALE PACKAGE OF IMAGE SENSOR AND MANUFACTURING METHOD THEREOF

CROSS-REFERENCE TO RELATED APPLICATIONS

This application claims the benefit of Korean Patent Application No. 10-2006-0098468 filed with the Korea Industrial Property Office on Oct. 10, 2006, the disclosure of which is incorporated herein by reference.

BACKGROUND OF THE INVENTION

1. Field of the Invention

The present invention relates to a wafer level chip scale package of an image sensor and a manufacturing method thereof. In the wafer level chip scale package of the image sensor, since expansion pads are provided instead of solder balls, a complicated process of forming solder balls can be omitted, thereby improving production capability. Since a glass is attached in a wafer level, defects caused by foreign particles can be minimized. Furthermore, miniaturization and slimness of the package can be realized.

2. Description of the Related Art

One of main trends in today's semiconductor industries is to miniaturize semiconductor devices as much as possible. The miniaturization is absolutely required in semiconductor chip package industries. Packaging is a technology that mounts an integrated circuit (IC) chip, where microcircuits are designed, onto an electronic device and seals it using a plastic resin or ceramic.

A typical package has a size much greater than an IC chip embedded therein. Therefore, package technicians have been interested in reducing the package size to a chip size level.

One of recently developed packages is a chip scale package (also called a chip size package). In particular, compared with a typical package method of assembling packages based on an individual chip, a wafer level chip scale package has features in that packages are assembled and manufactured in a wafer level.

The advance of semiconductor IC chips leads to the advance of package technologies, realizing high density, high speed, miniaturization, and thinning. More specifically, package devices are changing from a "pin insert type" or "through hole mount type" to a "surface mount type" in a structural aspect. In this way, a packaging density with respect to a circuit board is increased. Recently, studies have been actively conducted on chip size packages (CSPs) that can reduce the package size to a chip level while maintaining a characteristic of a bare chip at a package state.

In the case of a wafer level chip scale package (WLCSP) among chip size packages, chip pads are rerouted or redistributed on a chip surface, and solder balls are then formed. In the wafer level chip scale package, chips or dies are directly mounted onto a circuit board in a so-called flip chip scheme, and solder balls formed on the circuit where chips are rerouted are attached to conductive pads of the circuit board. Since solder balls are also formed on the conductive pads, they are attached to the solder balls of the package.

Recently, a variety of CSP technologies have been introduced which can make the chip size so small that there is almost no difference between the sizes of the semiconductor chip and the package. With the trends of miniaturization, high speed, and high integration, these technologies have spread faster than expected.

A wafer level package technology is considered as a next generation CSP technology. In the wafer level package technology, all assembling processes are finished in a wafer level where chips are not cut out. While a typical assembling process is performed after cutting the wafer into individual chips, the wafer level package technology is to perform a series of processes, e.g., a die bonding, a wire bonding, a molding, etc. in a wafer level where chips are attached to one another and then make final products by cutting the wafer into individual chips.

This technology can further reduce a total package cost than any other CSP technology.

In such a wafer level chip scale package, solder balls are formed on an active surface of a semiconductor chip. Due to this structure, there is a great structural difficulty in stacking the wafer level chip scale package or applying it to manufacture a sensor package such as a charge coupled device (CCD).

Korean Patent Laid-Open Publication No. 2002-74158 discloses a packaged IC device in which a package of an image sensor is manufactured using the wafer level chip scale package technology. The structure of the packaged IC device is illustrated in FIG. 1.

FIG. 1 is a cross-sectional view of an IC device having a microlens array 100 formed on a crystalline substrate.

Referring to FIG. 1, a packaging layer 106 is formed of glass under a crystalline substrate 102 where a microlens array 100 is formed on its surface. The packaging layer 106 is sealed by an epoxy 104. Electrical contacts 108 are formed along edges of the packaging layer 106. The electrical contacts 108 are connected to bumps 110, which are formed on the bottom surface of the packaging layer 106. In addition, the electrical contacts 108 are connected to conductive pads 112, which are formed on the top surface of the substrate 102.

A packaging layer 114, typically formed of glass, and associated spacer elements 116 are sealed over the substrate 102 by an adhesive such as an epoxy 118, thereby defining a cavity 120 between the microlens array 100 and the packaging layer 114.

The electrical contacts 108 are formed on inclined surfaces of the epoxy 104 and the packaging layer 106 by a plating process or the like.

In the conventional IC device, the electrical contacts 108 are formed so as to electrically connect the conductive pads 112 and the bumps 110. However, the reliability of connection is low because the conductive pads 112 and the electrical contacts 108 are connected in a face-to-face manner, and the structure and process become complicated because the IC device is manufactured by a stacking process.

International Patent Publication No. WO 99/040624 and Korean Patent Laid-Open Publication Nos. 2000-2962 and 2002-49940 disclose semiconductor devices having high-reliability ball grid array (BGA) using the wafer level chip scale package technology. In these semiconductor devices, solder bumps with solder balls mounted thereon are formed in order for electrical connection to pad electrodes. The formation of the solder balls requires a lot of forming processes and is complicated. Hence, the productivity of the semiconductor devices is low because of the increase in the number of the forming processes.

Furthermore, in the conventional chip scale package with the solder balls mounted thereon, a plurality of solder balls protrude downwardly. Therefore, the side or bottom surface of the package cannot be directly connected to a separate printed circuit board (PCB) or ceramic substrate during a hot bar process performed in manufacturing a socket type camera module. Consequently, separate contacts must be further provided for electrical connection of the package.

SUMMARY OF THE INVENTION

An advantage of the present invention is that it provides a wafer level chip scale package of an image sensor and a manufacturing method thereof. In the wafer level chip scale package of the image sensor, since expansion pads instead of solder balls are provided, a complicated process of forming solder balls can be omitted, thereby improving production capability. Since a glass is attached in a wafer level, defects caused by foreign particles can be minimized. Furthermore, miniaturization and slimness of the package can be realized.

Additional aspects and advantages of the present general inventive concept will be set forth in part in the description which follows and, in part, will be obvious from the description, or may be learned by practice of the general inventive concept.

According to an aspect of the invention, a wafer level chip scale package of an image sensor includes: a wafer including an image sensor and a pad on the top surface thereof and inclined surfaces on both ends thereof; expansion pads formed on the inclined surfaces of the wafer, including the pad, such that the expansion pads are electrically connected to the pad, the expansion pads having a bottom surface on a straight line with respect to that of the wafer; a support formed on the expansion pads to support both bottom surfaces of a glass, the support having a height to provide a space where an air cavity is formed; and a glass disposed on the support to provide the air cavity over the wafer.

The expansion pads may be formed conformally along the inclined surfaces of both ends of the wafer.

The wafer level chip scale package may further include second expansion pads formed on the expansion pad formed conformally along the inclined surfaces of both ends of the wafer so as to eliminate the surface height difference of the expansion pads.

The wafer level chip scale package may further include a seed metal layer formed between the expansion pad and the wafer.

The glass may be an infrared (IR) filter glass.

According to another aspect of the present invention, a method for manufacturing a wafer level chip scale package of an image sensor includes: forming pads at equal intervals on a wafer having an image sensor on the top surface thereof; forming a stepped portion by etching the top surface of the wafer corresponding to a scribe line between the pads; forming expansion pads on the stepped portion of the wafer, including the pads, to electrically connect to the pads; forming a support on the expansion pads to a predetermined height to provide a space where an air cavity is formed; attaching a glass to the top surface of the support to provide the air cavity over the wafer; performing a thinning process on the bottom surface of the wafer to expose the bottom surface of the expansion pads formed under the stepped portion; and dicing the resulting structure along the center of the expansion pads with the exposed bottom surfaces.

The stepped portion may have an inclined surface at the side thereof.

The stepped portion may have a depth ranging from approximately 50 µm to approximately 200 µm.

The forming of the stepped portion may include: forming a first resist layer on the wafer to cover the image sensor and the pads; patterning the first resist layer using a photolithography process to form a first resist pattern exposing the top surface of the wafer corresponding to the scribe line between the pads; forming the stepped portion by etching the top surface of the wafer using the first resist pattern as an etch mask; and removing the first resist pattern.

The expansion pads may be formed conformally along surface height difference of the stepped portion.

The method may further include forming second expansion pads on the expansion pads so as to eliminate the surface height difference of the expansion pads.

The forming of the expansion pads may include: forming a seed metal layer over the wafer having the stepped portion; forming a second resist layer on the seed metal layer; patterning the second resist layer using a photolithography process to form a second resist pattern covering the image sensor between the pads and exposing the stepped portion of the wafer, including the pads; forming the expansion pads on the stepped portion of the wafer including the pads, which is exposed by the second resist pattern; and removing the second resist pattern and the seed metal layer formed thereunder.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a cross-sectional view of a conventional crystalline substrate based device having an internal cavity;

FIG. 2 is a cross-sectional view of a wafer level chip scale package of an image sensor according to a first embodiment of the present invention;

FIGS. 3A and 3B are cross-sectional views illustrating a process of forming a first resist pattern in a manufacturing method of the wafer level chip scale package according to the first embodiment of the present invention;

FIGS. 4Aa and 4B are cross-sectional views illustrating a wet etching process in the manufacturing method according to the first embodiment of the present invention;

FIG. 5 is a cross-sectional view illustrating a process of forming a seed metal layer in the manufacturing method according to the first embodiment of the present invention;

FIGS. 6A and 6B are cross-sectional views illustrating a process of forming a second resist pattern in the manufacturing method according to the first embodiment of the present invention;

FIGS. 7A and 7B are cross-sectional views illustrating a process of forming expansion pads in the manufacturing method according to the first embodiment of the present invention;

FIG. 8 is a cross-sectional view illustrating a process of attaching a glass in the manufacturing method according to the first embodiment of the present invention;

FIG. 9 is a cross-sectional view illustrating a wafer thinning process in the manufacturing method according to the first embodiment of the present invention;

FIG. 10 is a cross-sectional view illustrating a dicing process in the manufacturing method according to the first embodiment of the present invention;

FIG. 11 is a cross-sectional view illustrating a wafer level chip scale package of an image sensor according to a first embodiment of the present invention;

FIGS. 12A and 12B are cross-sectional views illustrating a process of forming expansion pads in a manufacturing method of a wafer level chip scale package of an image sensor according to a second embodiment of the present invention;

FIG. 13 is a cross-sectional view illustrating a process of attaching a glass in the manufacturing method according to the second embodiment of the present invention;

FIG. 14 is a cross-sectional view illustrating a wafer thinning process in the manufacturing method according to the second embodiment of the present invention; and FIG. 15 is a cross-sectional view illustrating a dicing process in the manufacturing method according to the second embodiment of the present invention.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures. In the drawings, the thicknesses of layers and regions are exaggerated for clarity.

First Embodiment

FIG. 2 is a cross-sectional view of a wafer level chip scale package of an image sensor according to a first embodiment of the present invention.

Referring to FIG. 2, the wafer level chip scale package includes a wafer 10 having inclined surfaces on both ends thereof, expansion pads 17, a support 19, and a glass 20. The wafer 10 includes an image sensor 11 and a pad 12 on the top surface thereof. The expansion pads 17 are formed on the inclined surfaces of the wafer 10 such that they are electrically connected to the pad 12. In addition, the expansion pads 17 are disposed in a straight line with respect to the bottom surface of the wafer 10. The support 19 is disposed on the expansion pads 17 to support both bottom surfaces of the glass 20 and has a height to define a space where an air cavity 18 can be formed. The glass 20 is disposed on the support 19 such that the air cavity 18 is formed above the wafer 10.

The wafer 10 is formed of silicon. An image sensor (microlens) 11 is formed on an upper center portion of the wafer 10, and a pair of pads 12 is formed on both sides of the image sensor 11. The support 19 is formed on the pads 12 to support both ends of the bottom surfaces of the glass 20 attached thereon.

The support 19 may be formed by a lithography process using a photosensitive resin, such that it has a height to maintain a space where the air cavity 18 can be formed between the top surface of the image sensor 11 and the bottom surface of the glass 20.

The glass 20 can be attached by an adhesive (not shown) applied on the support 19. The adhesive uses a resin having a low out gasing during a curing process. Examples of the adhesive include an ultraviolet (UV) curing adhesive, an epoxy based adhesive, and a silicon based adhesive.

When the adhesive is attached to the glass 20, it must not flow into the space area of the cavity 18, i.e., the image sensor 11. Therefore, it is important to apply an appropriate amount of adhesive on the support 19.

The glass 20 can use an infrared (IR) filter glass so as to block IR rays.

Meanwhile, both ends of the wafer 10 corresponding to the outer side of the pad 12 are etched by an etching process to form the inclined surfaces. As shown in FIG. 2, the inclined surfaces on both ends of the wafer 10 deviate from both the vertical and horizontal planes of the wafer 10. The expansion pads 17 electrically connected to the pads 12 are formed on the inclined surfaces of the wafer 10 having the pads 12. The bottom surfaces of the expansion pad 17 and the wafer 10 form a straight line.

The expansion pads 17 may be formed by a metal plating process. Considering characteristics of the actual plating process, the expansion pads 17 can be formed conformally along the inclined surfaces of the both ends of the wafer 10. Seed metal layers 15 serving as seeds may be further formed between the expansion pads 17 and the wafer 10 during the metal plating process for forming the expansion pads 17.

As described above, the expansion pads 17 are formed on the inclined surfaces of the both ends of the wafer 10 having the pads 12 and their bottom surfaces are formed on a straight line with respect to the bottom surface of the wafer 10. Therefore, the expansion pads 17 and the pads 12 are electrically connected to each other to form a line.

The expansion pads 17 and the pads 12 form a conductive line, so that they have a structure that can be directly attached to a plane of an electrical assembly. Thus, the bottom surfaces of the expansion pads 17 can be directly attached to a socket type camera module.

In the conventional chip scale package where the solder-ball type bumps protrude, side and bottom surface connection can be achieved using a separate PCB or ceramic substrate during the connection of the socket type camera module. On the contrary, in the chip scale package according to the present invention, the bottom surfaces of the expansion pad 17 and the wafer 10 form a plane. Therefore, the expansion pad 17 can be directly connected to the socket type camera module. Consequently, the processes of manufacturing the camera module are reduced and the manufacturing cost is reduced by the reduction of the assembly parts.

A method for manufacturing a wafer level chip scale package according to a first embodiment of the present invention will be described below in detail with reference to FIGS. 3 to 10.

FIGS. 3 to 10 are cross-sectional views illustrating a method for manufacturing a wafer level chip scale package according to a first embodiment of the present invention.

FIGS. 3A to 3B are cross-sectional views illustrating a process of forming a first resist pattern in the manufacturing method according to the first embodiment of the present invention.

Referring to FIG. 3A, a wafer 10 having an image sensor 11 on the top surface thereof is prepared. Pads 12 are disposed at equal intervals around a scribe line of both sides of the image sensor 11. The scribe line is used as a dicing line in a dicing process, which will be described later.

A first resist layer 13 covering the image sensor 11 and the pads 12 is formed on the wafer 10 where the image sensor 11 and the pads 12 are formed. The first resist layer 13 is used as an etch mask in a wet etching process. The first resist layer 13 may be formed of $Si_3N_4$ by using a low pressure chemical vapor deposition (LPCVD) apparatus.

Referring to FIG. 3B, the first resist layer 13 is patterned by a photolithography process to form a first resist pattern 13a exposing the top surface of the wafer 10 corresponding to the scribe line between the pads 12.

FIGS. 4B and 4B are cross-sectional views illustrating a wet etching process in the manufacturing method according to the first embodiment of the present invention.

Referring to FIG. 4A, a stepped portion 14 is formed by etching the top surface of the wafer 10 using the first resist pattern 13a as an etch mask.

During the etching of the wafer 10, a wet etching process is performed on a region where the first resist pattern 13a is not formed. As illustrated in FIG. 4A, the stepped portion 14 is formed in a trapezoidal shape by controlling conditions of etchant and etching time. Since the wafer 10 is etched in the trapezoidal shape, sides of the stepped portion 14 are inclined.

An etching depth of the wafer 10, i.e., a depth of the stepped portion 14, may range from approximately 50 μm to 200 μm. The depth of the stepped portion 14 formed by the etching of the wafer 10 provides a space where the expansion pad 17 will be formed, and determines a final thickness of the wafer 10 subjected to a thinning process for exposing the expansion pad 17 of the chip scale package. When the depth of the stepped portion 14 is less than 50 μm, it is difficult to perform the thinning process. When the depth of the stepped portion 14 is greater than 200 μm, it is difficult to obtain a slim package. Therefore, it is preferable that the depth of the stepped portion 14 is in the range from approximately 50 μm to 200 μm.

In this case, 40% potassium hydroxide (KOH) of 70-90° C. is used as the etchant for the wet etching process. The etching conditions of the wafer 10 may be changed depending on the shapes and kinds of the wafer 10.

The etching characteristics of the wafer 10 are determined according to materials of the wafer, and kinds, concentration and temperature of the etchant. Furthermore, the etching rate can be adjusted fast or slowly according to kinds, concentration and temperature of the etchant.

In the case of a silicon wafer, a mixture of nitric acid ($HNO_3$) and hydrogen fluoride (6HF) is used for either monocrystalline silicon wafer or polycrystalline silicon wafer in the wet etching process. There is an etchant having an etching characteristic of which is dependent on silicon orientation. Examples of such an etchant include a mixture of potassium hydroxide and isopropyl alcohol.

Although the wafer 10 is etched by the wet etching process in the above-described embodiment, the wafer 10 can also be etched by a dry etching process.

Referring to FIG. 4B, after the etching of the wafer 10 is completed, the first resist pattern 13a used as the etch mask during the etching of the wafer 10 is removed. The first resist pattern 13a may be removed by a dry etching process such as a reactive ion etching (RIE) process.

FIG. 5 is a cross-sectional view illustrating a process of forming a seed metal layer in the manufacturing method according to the first embodiment of the present invention.

Referring to FIG. 5, a seed metal layer 15 is formed over the wafer 10 wherein the stepped portion 14 is formed. The seed metal layer 15 serves as a seed for performing a metal plating process in a subsequent process of forming an expansion pad 17.

FIGS. 6A and 6B are cross-sectional views illustrating a process of forming a second resist pattern in the manufacturing method according to the first embodiment of the present invention. Referring to FIG. 6A, a second resist layer 16 is formed on the seed metal layer 15. The second resist layer 16 defines, in the subsequent process, a region where the expansion pad 17 will be formed and protects the remaining region. Like the first resist layer 13, the second resist layer 16 may be formed of $Si_3N_4$ by using an LPCVD apparatus.

Referring to FIG. 6B, the second resist layer 16 is patterned by a photolithography process to form a second resist pattern 16a covering the region image sensor region between the pads 12 and exposing the stepped portion 14 of the wafer 10 including the pads 12.

FIGS. 7a and 7b are cross-sectional views illustrating a process of forming the expansion pad in the manufacturing method according to the first embodiment of the present invention.

Referring to FIG. 7A, an expansion pad 17 is formed on the stepped portion 14 of the wafer 10 including the pads 12, which is exposed by the second resist pattern 16a. The expansion pad 17 may be formed by a metal plating process using the seed metal layer 15 as the seed. The expansion pad 17 is formed on the stepped portion 14 including the pads 12 and is electrically connected to the pads 12.

Considering characteristics of an actual plating process, the expansion pad 17 formed by the metal plating process can be formed conformally along the surface of the stepped portion 14.

Referring to FIG. 7B, after completing the metal plating process for forming the expansion pad 17, the second resist pattern 16a and the seed metal layer 15 formed thereunder are removed. The second resist pattern 16a may be removed by a dry etching process such as an RIE process.

FIG. 8 is a cross-sectional view illustrating a process of attaching a glass in the manufacturing method according to the first embodiment of the present invention. Referring to FIG. 8, a support 19 is formed on the expansion pad 17 to a predetermined height at which it can provide a space where an air cavity 18 can be formed.

The forming of the support 19 may include coating a photosensitive resin and patterning it to a predetermined height by a photolithography process.

In the forming of the pattern of the support 19, a photosensitive resin is coated and only a pattern is formed. Then, an adhesive is coated on the pattern. Alternatively, the pattern may also be formed using a resin such as benzocyclobutene (BCB) without separate adhesive.

After forming the support 19, an adhesive is applied on the support 19 and a glass 20 is attached to the top surface of the support 19 to thereby provide an air cavity 18 over the wafer 10.

FIG. 9 is a cross-sectional view illustrating a wafer thinning process in the manufacturing method according to the first embodiment of the present invention.

Referring to FIG. 9, a thinning process is performed on the bottom surface of the wafer 10 to expose the bottom surface of the expansion pad 17 formed under the stepped portion 14.

The thickness of the wafer 10 is approximately 700 μm before the thinning process but is reduced to approximately 50 μm to 200 μm after the thinning process.

The thinning process of the wafer 10 contributes to the slimness of the chip scale package and exposes the bottom surface of the expansion pad 17 electrically connected to the pad 12. Hence, the package can be directly mounted onto the camera module without separate PCB or ceramic substrate. Therefore, the assembly space of the module is reduced, contributing to the miniaturization of products. Furthermore, the manufacturing cost of substrates is reduced, thus decreasing unit price of products.

Since the expansion pad 17 with the exposed bottom surface serves as the solder ball, a rerouting or redistributing process of forming solder balls and conductive lines is omitted. Therefore, the number of package manufacturing processes is significantly simplified, thus reducing manufacturing time and improving production capability.

In the wafer level chip scale package of the image sensor, defects caused by foreign particles can be minimized because the glass is directly attached in the wafer level.

FIG. 10 is a cross-sectional view illustrating a dicing process in the manufacturing method according to the first embodiment of the present invention.

Referring to FIG. 10, the package completed in the wafer level are cut into individual packages by using the center of the expansion pad 17 with the exposed bottom surface, i.e., the scribe line between the pads 12, as the dicing line. Therefore, the expansion pads 17 are formed on the inclined surfaces of both ends of the wafer 10, and the bottom surface of the expansion pads are on a straight line with respect to that of the wafer 10. The expansion pads 17 and the pads 12 form the electrical conductive lines. In this way, the manufacturing of the wafer level chip scale package is completed.

Second Embodiment

A wafer level chip scale package of an image sensor according to a second embodiment of the present invention will be described below in detail with reference to FIG. 11. Detailed description about parts similar to those of the first embodiment will be omitted, but parts different from those of the second embodiment will be described below.

FIG. 11 is a cross-sectional view illustrating a wafer level chip scale package of an image sensor according to a second embodiment of the present invention.

Referring to FIG. 11, the wafer level chip scale package of the image sensor according to the second embodiment differs from that of the first embodiment in that a second expansion pad 17a is further formed on the expansion pad 17 formed conformally along the inclined surface of both ends of the wafer 10 so as to eliminate the surface height difference of the expansion pad 17.

In the first embodiment, the expansion pad 17 is formed conformally along the inclined surfaces of both ends of the wafer 10 by the plating process. Thus, the surface of the expansion pad 17 has the same height difference as the inclined surface. However, in the second embodiment, a metal plating process is further performed to form a second expansion pad 17a so as to eliminate the surface height difference of the expansion pad 17.

The wafer level chip scale package according to the second embodiment can obtain the same effects as that of the first embodiment.

Hereinafter, a method for manufacturing the wafer level chip scale package according to the second embodiment of the present invention will be described below with reference to FIGS. 12 to 15.

FIGS. 12 to 15 are cross-sectional views illustrating the method for manufacturing the wafer level chip scale package of the image sensor according to the second embodiment of the present invention. The process of forming the first resist pattern 13 on the wafer 10 (see FIG. 3A) to the process of forming the expansion pad 17 conformally along the inclined surfaces 14 (see FIG. 7A) will be omitted.

FIGS. 12A and 12B are cross-sectional views illustrating a process of forming an expansion pad in the manufacturing method according to the second embodiment of the present invention.

Referring to FIG. 12A, after forming the expansion pad 17 conformally along the surface height difference of the stepped portion 14 by the metal plating process, a second expansion pad 17a is formed on the expansion pad 17 so as to eliminate the surface height difference of the expansion pad 17. The second expansion pad 17a may be formed by a metal plating process.

Referring to FIG. 12B, after completing the metal plating process for forming the second expansion pad 17a, the second resist pattern 16a and the seed metal layer 15 formed thereunder are removed.

FIG. 13 is across-sectional view illustrating a process of attaching a glass in the manufacturing method according to the second embodiment of the present invention. Referring to FIG. 13, a support 19 is formed on the expansion pad 17 having the second expansion pad 17a to a predetermined height at which it can provide a space where an air cavity 18 can be formed.

After forming the support 19, an adhesive is applied on the support 19 and a glass 20 is attached on the support to thereby define the air cavity 18 over the wafer 10.

FIG. 14 is a cross-sectional view illustrating a process of thinning the wafer in the manufacturing method according to the second embodiment of the present invention. Referring to FIG. 14, a thinning process is performed on the bottom surface of the wafer 10 to expose the bottom surface of the expansion pad 17 formed under the stepped portion 14.

FIG. 15 is a cross-sectional view illustrating a dicing process in the manufacturing method according to the second embodiment of the present invention.

Referring to FIG. 15, the package completed in the wafer level are cut into individual packages along the dicing line defined by the center of the expansion pad 17 with the exposed bottom surface, i.e., the scribe line between the pads 12.

As described above, the expansion pads are formed on the inclined surfaces of both ends of the wafer where the image sensor and the pads are formed, such that they are electrically connected to the pads. Further, the bottom surfaces of the expansion pads are on the straight line with respect to the bottom surface of the wafer. Hence, the package can be directly mounted onto the camera module without separate PCB or ceramic substrate. Therefore, the assembly space of the module is reduced, contributing to the miniaturization of products. Furthermore, the manufacturing cost of substrates is reduced, thus decreasing unit price of products.

Since the expansion pad with the exposed bottom surface serves as the solder ball, a rerouting or redistributing process of forming solder balls and conductive lines is omitted. Therefore, the number of package manufacturing processes is significantly simplified, thus reducing manufacturing time and improving production capability.

Furthermore, the wafer level chip scale package of the image sensor can minimize defects caused by foreign particles because the glass is directly attached in the wafer level.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A wafer level chip scale package of an image sensor, comprising:
   a wafer including an image sensor and a pad on the top surface of the wafer, and inclined surfaces formed on both ends of the wafer, the inclined surfaces on both ends of the wafer deviating from both vertical and horizontal planes of the wafer;
   a seed metal layer on the top surface of the wafer covering the pad;
   a first expansion pad including an upper end formed on the top surface of the wafer covering the seed metal layer, such that the first expansion pad is electrically connected to the pad, a bottom surface of a lower end of the first expansion pad and the bottom surface of the wafer that is formed on a plane, and an inclined portion of the first expansion pad formed between the upper end and the lower end that is inclined along the inclined surface of the wafer;
   a second expansion pad formed on the lower end and the inclined portion of the first expansion pad so as to have the same surface height as the top surface of the upper end of the first expansion pad;

a support formed on the first and second expansion pads to support the bottom surface of a glass, the support having a height to provide a space where an air cavity is formed; and the glass being disposed on the support to provide the air cavity over the wafer, wherein the top surface of the upper end of the first expansion pad and the top surface of the upper end of the second expansion pad form a flat surface, wherein the first expansion pad is formed by a plating process using the seed metal layer as the seed, and the second expand pad is formed on the first expansion pad by a plating process so as to eliminate the surface height difference of the first expansion pad.

2. The wafer level chip scale package according to claim 1, wherein the first expansion pad is formed conformally along the inclined surfaces of both ends of the wafer.

3. The wafer level chip scale package according to claim 1, wherein the glass is an infrared (IR) filter glass.

* * * * *

UNITED STATES PATENT AND TRADEMARK OFFICE
CERTIFICATE OF CORRECTION

| | |
|---|---|
| PATENT NO. | : 8,053,868 B2 |
| APPLICATION NO. | : 11/905314 |
| DATED | : November 8, 2011 |
| INVENTOR(S) | : Jin Mun Ryu et al. |

It is certified that error appears in the above-identified patent and that said Letters Patent is hereby corrected as shown below:

Column 12, Line 3, in claim 1, delete "expand" and insert -- expansion --, therefor.

Signed and Sealed this
Fourteenth Day of February, 2012

David J. Kappos
*Director of the United States Patent and Trademark Office*